United States Patent
Seo

(10) Patent No.: US 6,998,324 B2
(45) Date of Patent: Feb. 14, 2006

(54) METHODS OF FABRICATING SILICON ON INSULATOR SUBSTRATES FOR USE IN SEMICONDUCTOR DEVICES

(75) Inventor: Young Hun Seo, Seoul (KR)

(73) Assignee: Dongbu Anam Semiconductor, Inc., Seoul (KR)

( * ) Notice: Subject to any disclaimer, the term of this patent is extended or adjusted under 35 U.S.C. 154(b) by 70 days.

(21) Appl. No.: 10/750,251

(22) Filed: Dec. 31, 2003

(65) Prior Publication Data

US 2004/0157401 A1    Aug. 12, 2004

(30) Foreign Application Priority Data

Feb. 4, 2003    (KR) .................... 10-2003-0007000

(51) Int. Cl.
*H01L 21/762*    (2006.01)
(52) U.S. Cl. ...................................... 438/404; 438/409
(58) Field of Classification Search ........ 438/404–412, 438/424–426
See application file for complete search history.

(56) References Cited

U.S. PATENT DOCUMENTS

| 4,643,804 | A | * | 2/1987 | Lynch et al. .................. 205/50 |
| 4,982,263 | A | * | 1/1991 | Spratt et al. ................. 257/524 |
| 5,217,920 | A | * | 6/1993 | Mattox et al. ............... 438/431 |
| 5,767,561 | A | * | 6/1998 | Frei et al. .................... 257/499 |
| 6,319,333 | B1 | * | 11/2001 | Noble ........................ 148/33.2 |
| 6,437,417 | B1 | * | 8/2002 | Gilton ......................... 257/506 |
| 6,506,658 | B1 | * | 1/2003 | D'Arrigo et al. ............ 438/359 |

* cited by examiner

*Primary Examiner*—Evan Pert
(74) *Attorney, Agent, or Firm*—Hanley, Flight & Zimmerman LLC

(57) ABSTRACT

Example methods of fabricating a silicon on insulator substrate are disclosed. One example method may include forming a plurality of trenches on a substrate, forming an insulation layer on the trenches, removing a portion of the insulation layer formed on the trenches to partially expose the substrate, and forming a silicon on insulator film in the substrate via the exposed portions of the substrate.

3 Claims, 5 Drawing Sheets

METHODS OF FABRICATING SILICON ON INSULATOR SUBSTRATES FOR USE IN SEMICONDUCTOR DEVICES

TECHNICAL FIELD

The present disclosure relates to semiconductor devices and, more particularly, to methods of fabricating silicon on insulator ("SOI") substrates for use in semiconductor devices.

BACKGROUND

Recently, as design rules for semiconductor devices are decreased and the semiconductor device is integrated, a SOI structure has attracted considerable attention as a way to reduce junction capacitance between a silicon substrate and junctions by providing an insulator between the silicon substrate and semiconductor devices.

In a SOI substrate having the SOI structure, isolation is achieved by employing a silicon oxide film as an insulation film. Therefore, in case that the SOI substrate is used in a semiconductor field, it is possible to prevent soft errors and/or a latch up phenomena to improve reliability of the semiconductor device. Further, because the junction capacitance of the impurity diffuse layer of active regions can be reduced in case of an integrated circuit having the SOI structure, the amount of charge and discharge current due to switching decreases, resulting in reduced power consumption.

The SOI substrate is, however, more expensive than the typical silicon substrate. Further, fine defects may be generated in the insulation film of the SOI substrate, thereby deteriorating the yield of the semiconductor device.

In order to solve the problems, a study of a method for fabricating a SOI structure in a logic process has been conducted. Referring to FIGS. 1A to 1D, there are provided schematic cross sectional views setting forth a prior approaches for fabricating shallow trench isolation("STI").

The prior method begins with the preparation a silicon substrate 1. As shown in FIG. 1A, an oxide layer is deposited on the silicon substrate 1 as a first insulation layer 2 and a nitride layer is deposited thereon as a second insulation layer 3. Next, on the second insulation layer 3 are formed photoresist patterns 4 serving to a mask by applying and patterning photoresist thereon.

Referring to FIG. 1B, portions of the second insulation layer 3 uncovered with the photoresist patterns 4 are removed by a dry etching to partially expose the first insulation layer 2. Subsequently, thus exposed portions of the first insulation layer 2 are removed by a dry etching till the silicon substrate 1 is partially exposed therethrough. Next, thus exposed portions of the silicon substrate 1 are etched in a predetermined thickness by a dry etching to form trenches 5.

Referring to FIG. 1C, the photoresist patterns 4 are removed and then cleaning is performed. Next, a gap filling is carried out on the trenches 5 by using trench filling material to form a trench isolation layer 6. Thereafter, a chemical mechanical polishing is performed to remove a portion of the trench isolation layer 6 covering the top surface of the second insulation film 3 to form trench isolation films 7 (see FIG. 1D), thereby producing a shallow trench isolation ("STI") structure where the trench isolation films 7 are disposed in only the trenches 5, i.e., non-active regions.

Thereafter, the second insulation layer 3 used in establishing STI structure are removed by a wet etching and then semiconductor devices are formed by various processes, e.g., an ion implantation.

DETAILED DESCRIPTION

Figure 1A:
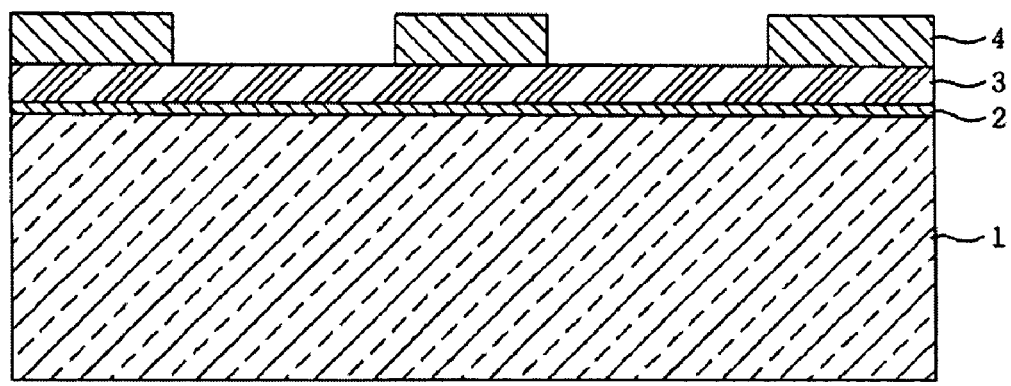
FIGS. 1A to 1D show schematic cross sectional views setting forth a prior method for fabricating a shallow trench isolation.
Figure 1B:
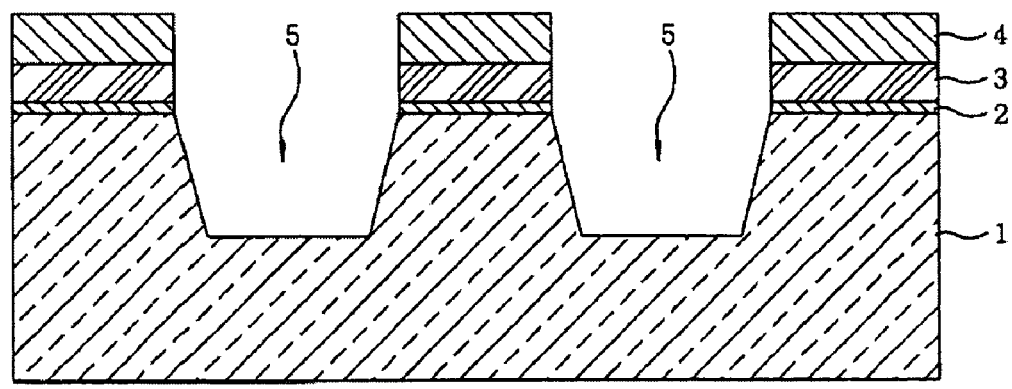
Figure 1C:
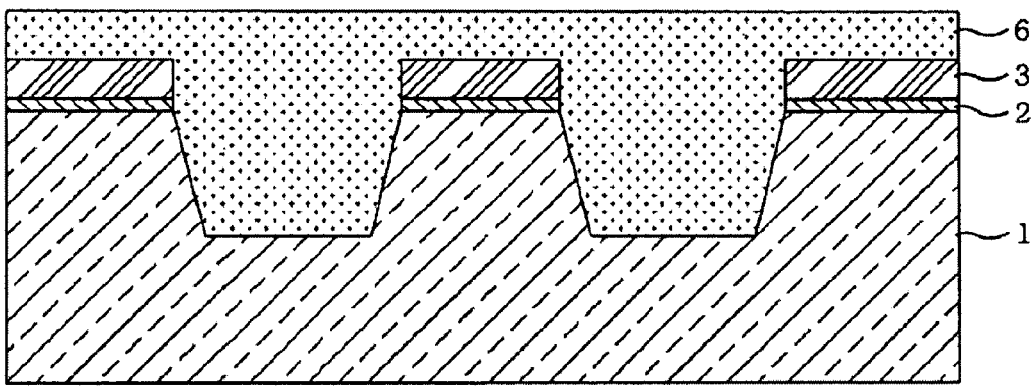
Figure 1D:
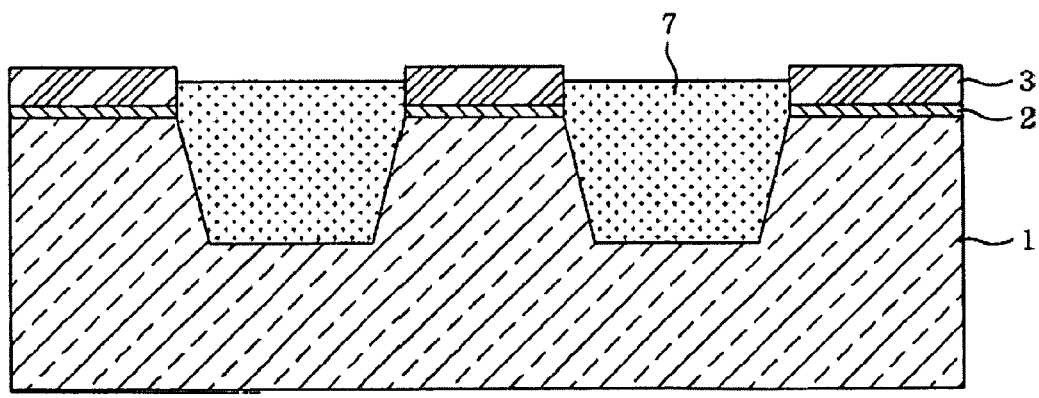
Figure 2A:
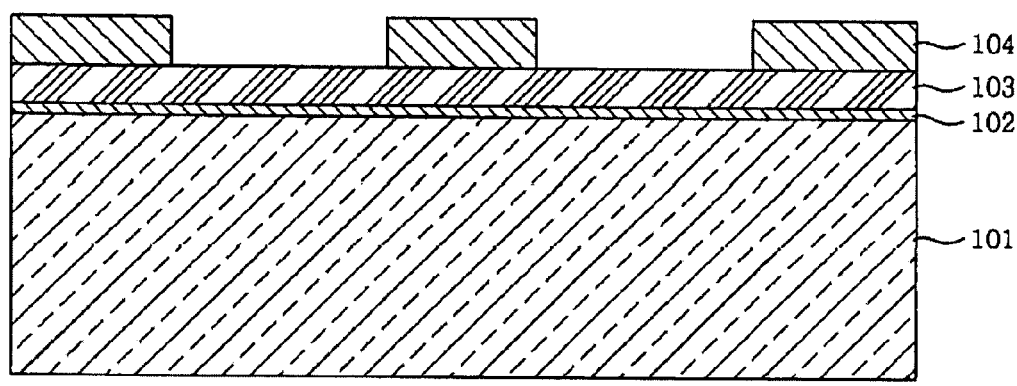
FIGS. 2A to 2F provide schematic cross sectional views setting forth an example disclosed method of fabricating a silicon on insulator substrate for use in a semiconductor.

The method for fabricating the SOI substrate begins with the preparation an N-type or a P-type single silicon substrate 101. As shown in FIG. 2A, an oxide layer is deposited on the substrate 101 as a first insulation layer 102 and a nitride layer is deposited thereon as a second insulation layer 103. Subsequently, on the second insulation layer 103 are formed photoresist patterns 104 serving to a mask by applying and patterning photoresist thereon.

Figure 2B:
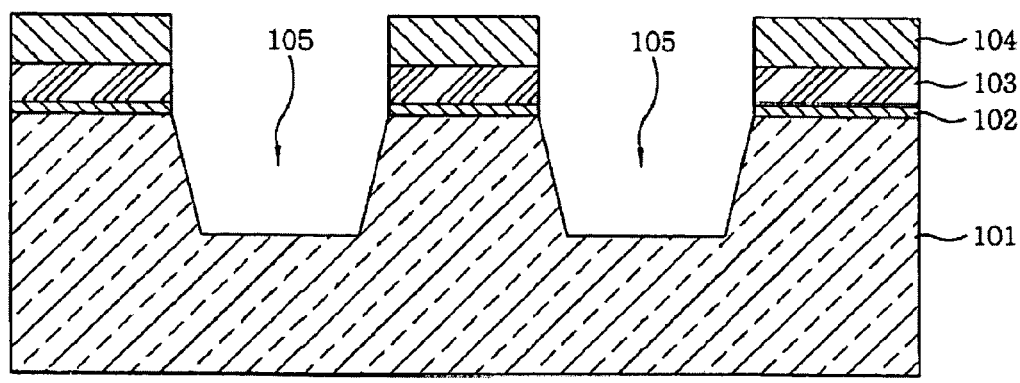

Referring to FIG. 2B, portions of the second insulation layer 103 uncovered with the photoresist patterns 104 are removed by dry etching to partially expose the first insulation layer 102. Subsequently, thus exposed portions of the first insulation layer 102 are removed by dry etching till the silicon substrate 101 is partially exposed therethrough. Next, thus exposed portions of the silicon substrate 101 are etched in a predetermined thickness by dry etching to form trenches 105, each of the trenches 105 having a peripheral region and a bottom region.

Figure 2C:
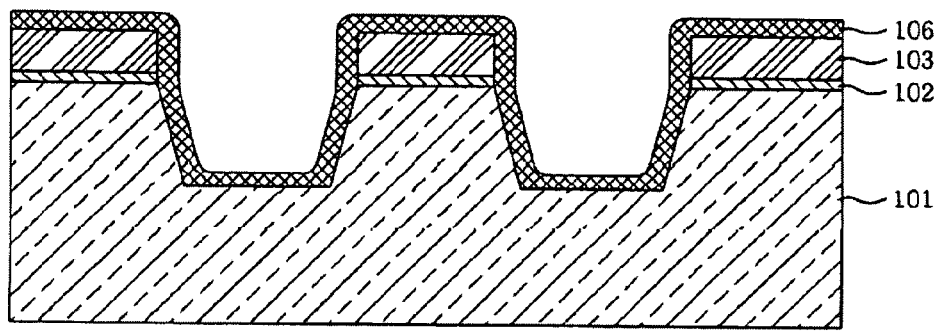

Referring to FIG. 2C, the photoresist patterns 104 are removed and then cleaning is performed. Thereafter, another nitride layer is deposited as a third insulation layer 106.

Figure 2D:
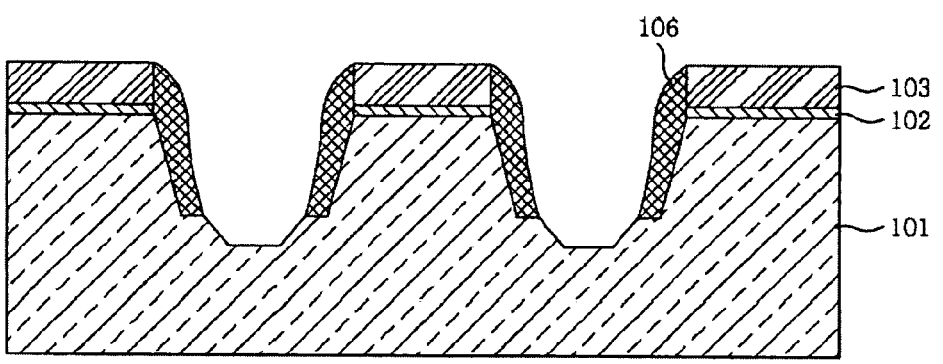

As shown in FIG. 2D, an etch-back process is performed on the third insulation layer 106 to remove portions of third insulation layer 106 that cover a top surface of the second insulation layer 103 and the bottom regions of the trenches 105, so that the silicon substrate 101 is partially exposed. In other words, portions of the third insulation layer 106 covering the peripheral surfaces of the trenches 105 are not removed.

Figure 2E:
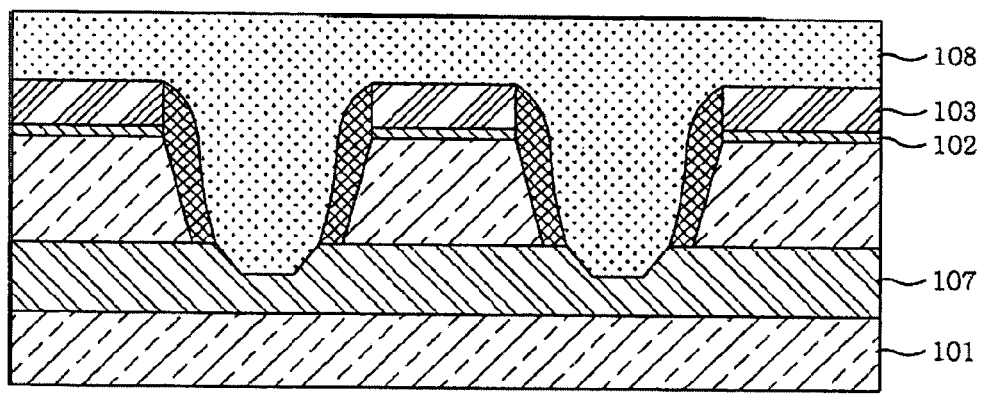
Figure 2F:
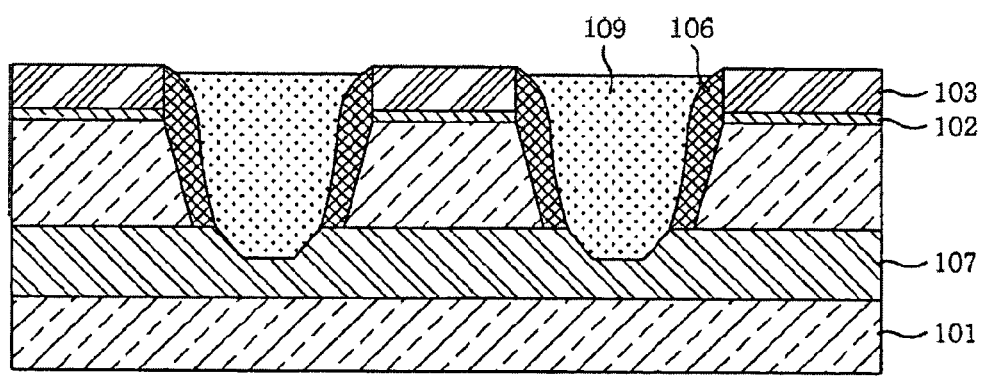

As shown in FIG. 2E, an anodization is carried out on the silicon substrate 101 through the exposed bottom portions of the trenches 105 to form a porous silicon film therein. Thus formed porous silicon film is changed into a silicon oxide ($SiO_2$) film by an oxidation reaction to obtain a SOI film 107. At this time, portions of the third insulation layer 106 covering the peripheral surfaces of the trenches 105 serve to protect active regions of the silicon substrate 101 where semiconductor devices will be formed. Subsequently, gap filling is carried out on the trenches 105 by using trench filling material to form a trench isolation layer 108. Thereafter, a chemical mechanical polishing is performed to remove a portion of the trench isolation layer 108 covering the top surface of the second insulation film 103 to form trench isolation films 109 (see FIG. 2F), thereby producing a shallow trench isolation ("STI") structure where the trench isolation films 109 are disposed in only the trenches 105, i.e., non-active regions. Accordingly, it is possible to obtain a SOI substrate where the SOI film 107 is provided between the active regions and the silicon substrate 101.

Thereafter, the second insulation layer 103 used in establishing STI structure are removed by a wet etching and then semiconductor devices are formed by a various processes, e.g., an ion implantation. In such a SOI substrate, it is possible to improve the yield of the semiconductor device and stabilize the performance thereof by forming the SOI film therein.

As disclosed herein, an example method of fabricating a silicon on insulator substrate for use in a semiconductor structure may include forming a plurality of trenches on a substrate; forming an insulation layer on the trenches; removing a portion of the insulation layer formed on the trenches to partially expose the substrate; and forming a silicon on insulator film in the substrate via the exposed portions of the substrate.

An alternative example method of fabricating a silicon on insulator substrate for use in a semiconductor structure may include forming a plurality of trenches on a substrate, each of the trenches having an inner surface divided into a peripheral surface and a bottom region; forming an insulation layer on the inner surface of each of the trenches and top of the substrate; removing a portion of the insulation layer formed on the bottom region of each of the trenches to partially expose the substrate, wherein a portion of the insulation layer formed on the peripheral surfaces of each of the trenches remains; forming a silicon on insulator film in the substrate via the exposed portions of the substrate; and filling the trenches with trench filling material to form trench insulation films.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of fabricating a silicon on insulator substrate for use in a semiconductor structure, the method comprising:

forming a plurality of trenches on a substrate, each of the trenches having an inner surface divided into a peripheral surface and a bottom region;

forming an insulation layer on the inner surface of each of the trenches and top of the substrate;

removing a portion of the insulation layer formed on the bottom region of each of the trenches to partially expose the substrate, wherein a portion of the insulation layer formed on the peripheral surfaces of each of the trenches remains;

forming a silicon on insulator film in the substrate via the exposed portions of the substrate; and filling the trenches with trench filling material to form trench insulation films, wherein the silicon on insulator film forming includes performing an anodization on the substrate through the bottom regions of the trenches to form a porous silicon film therein, and the porous silicon film is changed into a silicon oxide film by an oxidation reaction.

2. A method as defined by claim 1, wherein the silicon on insulator film forming is performed by an oxidation process.

3. A method as defined by claim 2, wherein the portion of the insulation layer formed on the peripheral surface of each of the trenches serves as a protection film of protecting an active region of the substrate during the oxidation process.

* * * * *